United States Patent
Camillo-Castillo et al.

(10) Patent No.: US 10,164,101 B1
(45) Date of Patent: Dec. 25, 2018

(54) TRANSISTOR WITH IMPROVED CHANNEL MOBILITY

(71) Applicant: GLOBALFOUNDRIES INC., Grand Cayman (KY)

(72) Inventors: Renata A. Camillo-Castillo, Williston, VT (US); Anthony K. Stamper, Burlington, VT (US); Vibhor Jain, Essex Junction, VT (US); Mark D. Jaffe, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/790,707

(22) Filed: Oct. 23, 2017

(51) Int. Cl.
| | | |
|---|---|---|
| *H01L 21/82* | (2006.01) | |
| *H01L 29/78* | (2006.01) | |
| *H01L 27/092* | (2006.01) | |
| *H01L 27/12* | (2006.01) | |
| *H01L 21/764* | (2006.01) | |
| *H01L 21/8238* | (2006.01) | |
| *H01L 21/84* | (2006.01) | |
| *H01L 23/66* | (2006.01) | |

(52) U.S. Cl.
CPC ........ *H01L 29/7849* (2013.01); *H01L 21/764* (2013.01); *H01L 21/8238* (2013.01); *H01L 21/84* (2013.01); *H01L 23/66* (2013.01); *H01L 27/092* (2013.01); *H01L 27/1214* (2013.01)

(58) Field of Classification Search
CPC .................. H01L 21/823807; H01L 29/7846
See application file for complete search history.

(56) References Cited

U.S. PATENT DOCUMENTS

| | | |
|---|---|---|
| 5,397,904 A | 3/1995 | Amey et al. |
| 6,613,652 B2 | 9/2003 | Lim et al. |
| 7,015,147 B2 | 3/2006 | Lee et al. |
| 7,253,488 B2 | 8/2007 | Zhan et al. |
| 7,642,167 B2 | 1/2010 | Kwon et al. |
| 8,455,308 B2 | 6/2013 | Cheng et al. |
| 2005/0062080 A1* | 3/2005 | Nakamura ........ H01L 29/66772 257/288 |

FOREIGN PATENT DOCUMENTS

| | | |
|---|---|---|
| WO | 2011088362 | 7/2011 |

OTHER PUBLICATIONS

Nguyen, "Introduction to MEMS Design Fall 2010; Module 8: Microstructural Elements", https://inst.eecs.berkeley.edu/~ee245/fa10/modules/LecM8.MicrostructuralElements.pdf, Oct. 12, 2010, 21 pages.

(Continued)

*Primary Examiner* — Thomas L Dickey
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to transistors with improved channel mobility and methods of manufacture. A structure includes: a curved beam structure formed from at least one stressed material; a cavity below the curved beam structure; and at least one semiconductor device on a top portion or a bottom portion of the curved beam structure whose carrier mobility is increased or decreased by a curvature of the curved beam structure.

17 Claims, 6 Drawing Sheets

(56) References Cited

OTHER PUBLICATIONS

Cheung, "Micro-Electro-Mechanical Systems (MEMS) Fabrication", http://www-inst.eecs.berkeley.edu/~ee143/fa10/lectures/Lec_24.pdf, 42 pages.
S. Suthram, "Study of the piezoresistive properties of Si, Ge and GaAs MOSFETs using a novel flexure based wafer bending setup," Ph.D. dissertation, University of Florida, Gainesville, May 2008, 108 pages.

* cited by examiner

TRANSISTOR WITH IMPROVED CHANNEL MOBILITY

FIELD OF THE INVENTION

The present disclosure relates to semiconductor structures and, more particularly, to transistors with improved channel mobility and methods of manufacture.

BACKGROUND

Scaling of devices has been instrumental in the improvements in speed and power consumption of devices, e.g., transistor technologies in RF applications. As newer technology nodes are being designed, parameters such as MOSFET gate oxide thickness and the power supply voltage have also been reduced. In fact, scaling of devices has also reduced capacitances of such devices.

Although technology has progressed significantly, such evolution (scaling) of the devices is becoming increasingly more difficult. For RF FET switches which operate at AC power levels of 10's or 100's of watts, this scaling is less important due to concerns about degrading the FET breakdown. For these RF FET switches, their performance has been improved primarily by reducing the channel mobility through the use of strained films over the gate and by changing the implants and anneals used to fabricate the FETs.

To increase efficiencies, other design schemes, in addition to the use of stressed films and other process parameters, have emerged. These design schemes include SOI technologies, as well as the use of strained materials under the devices (in the channel of the device) to increase channel mobility. For example, using strained nitride films has increased the channel mobility of RF SOI NFET switches by approximately 5%. However, these strained films are very thick, e.g., on the order of 65 nm, and do not scale well to tighter ground rules in smaller technology nodes.

SUMMARY

In an aspect of the disclosure, a structure comprises: a curved beam structure formed from at least one stressed material; a cavity below the curved beam structure; and at least one semiconductor device on a top portion or a bottom portion of the curved beam structure whose carrier mobility is increased or decreased by a curvature of the curved beam structure.

In an aspect of the disclosure, a structure comprises: a curved beam structure composed of at least an oxide material and semiconductor material; a cavity in a substrate material which is under the curved beam structure; and a semiconductor device on the curved beam structure which has a stress imparted thereon from a curvature of the curved beam structure which affects a carrier mobility of the semiconductor device.

In an aspect of the disclosure, a method comprises: forming a curved beam structure by venting material under semiconductor material to form a cavity and release a stress of material which composes the curved beam structure; and forming at least one semiconductor whose carrier mobility is increased or decreased by the beam curvature near a top or a bottom surface of the curved beam structure such that a stress is imparted on an active region of the at least one semiconductor device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to transistors with improved channel mobility and methods of manufacture. More specifically, the present disclosure relates to silicon on insulator (SOI) field effect transistors (FET) formed on a curved beam structure. Advantageously, the curved beam structure provides improved channel mobility to the transistor by imparting stress (e.g., tensile stress on semiconductor material) in the channel of the transistor.

To improve channel mobility, the curved beam structure can be curved concave downwards for a PFET or concave upwards for an NFET. In more specific embodiments, the curved beam structure can have a concave upward curvature with an NFET at or near the bottom or a PFET at or near a top of the beam structure. Alternatively, the curved beam structure can have a downward curvature with a PFET at or near the bottom or an NFET at or near the top of the beam structure. In embodiments, the curved beam structure can be above a cavity formed in SOI technologies or in a bulk non-SOI wafer. In additional embodiments, the curved beam structure can be above and below a cavity.

The curved beam structure can have different degrees of curvature. For example, the curved beam structure can include a curvature of about 5 degrees to increase carrier mobility in the channel of the device by about 20%. In further examples, the curved beam structure can be a single beam structure with a "high" curvature, e.g., 13 μm of bend. Alternatively, or in addition, the curved beam structure can be broken into multiple small beams with "low" curvature, e.g., 2 μm of bend, and wiring above the FET.

The curved beam structures of the present disclosure can be manufactured in a number of ways using a number of different tools. In general, though, the methodologies and tools are used to form structures with dimensions in the micrometer and nanometer scale. The methodologies, i.e., technologies, employed to manufacture the curved beam structures of the present disclosure have been adopted from integrated circuit (IC) technology. For example, the structures are built on wafers and are realized in films of material patterned by photolithographic processes on the top of a wafer. In particular, the fabrication of the curved beam structures uses three basic building blocks: (i) deposition of thin films of material on a substrate, (ii) applying a patterned mask on top of the films by photolithographic imaging, and (iii) etching the films selectively to the mask.

Figure 1:
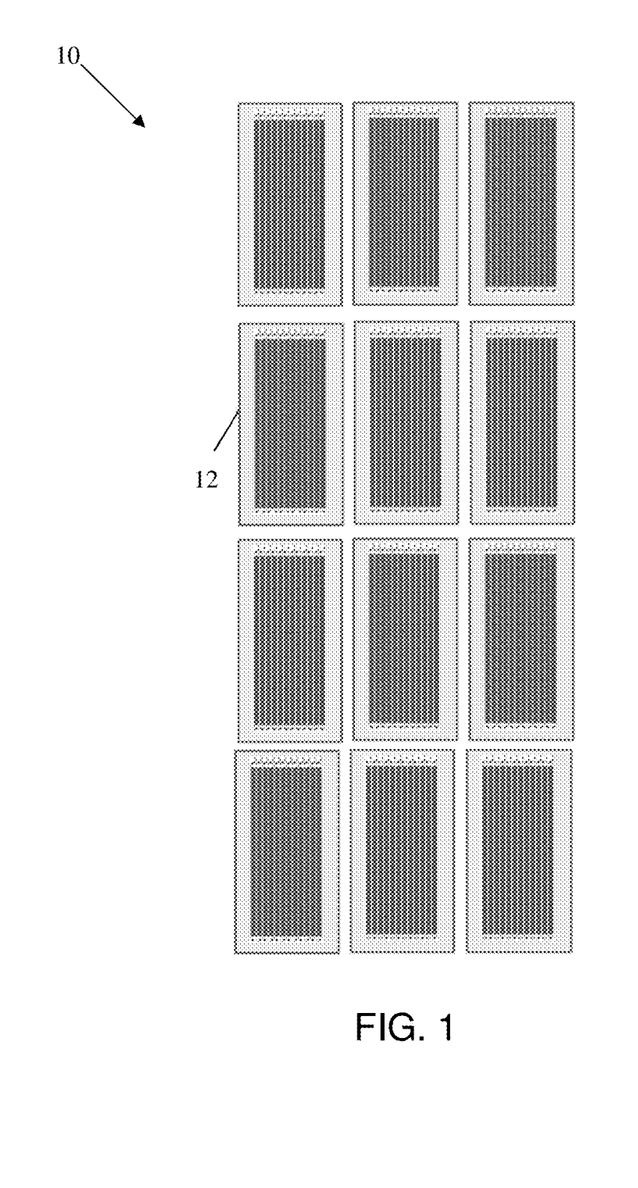
FIG. 1 shows a top plan view of a switch layout in accordance with aspects of the present disclosure.

FIG. 1 shows a top plan view of a switch layout in accordance with aspects of the present disclosure. In embodiments, the switch layout 10 can be an NFET switch layout comprising a plurality of banks of transistors 12. In embodiments, the plurality of banks of transistors 12 can each comprise a stack of transistors, e.g., 12 stack of transistors. Although not a limiting feature, each bank of transistors can be about 20 µm wide by 50 µm long. The transistors 12 can be, e.g., field effect transistors (FET), and more specifically, MOSFETs formed on a curved beam structure. As other examples, the transistors can be NPN bipolar transistors comprising a layer of P-doped semiconductor between two N-doped layers or, alternatively, a PNP transistor comprising a layer of N-doped semiconductor between two P-doped layers, a nominal MESFET, a nominal NFET, a nominal PFET, or as a further alternative, a SOI NFET switch structure, amongst other examples.

Figure 2A:
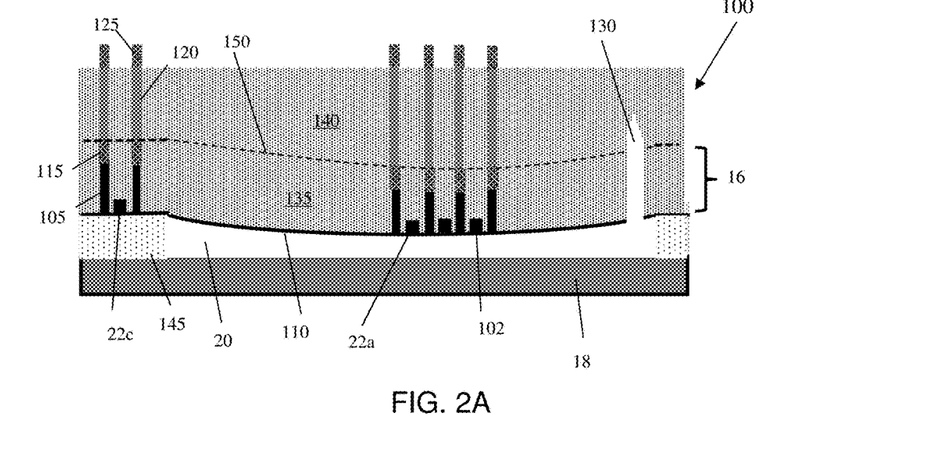
FIGS. 2A and 2B show transistors (or other devices) on a curved beam structure, amongst other features, and respective fabrication processes in accordance with aspects of the present disclosure.

FIG. 2A shows a representative cross-sectional view of transistors formed on a curve beam structure in accordance with aspects of the present disclosure, and respective fabrication processes. In embodiments, the structure 100 has a curved beam structure 16 formed over a substrate (semiconductor wafer) 18, with a cavity 20 formed under the curved beam structure 16. For this embodiment, a device 22a formed on a bottom of the curved beam 16 is a single NFET containing three gate fingers; although other configurations are also contemplated herein. The NFET includes a poly gate 102, as an example although any FET configuration, such as one using a metal gate, could be used. The poly gate 102 of the NFET 22a is formed on an SOI thin-silicon layer 110, which has thickness in the range of 10 nm to 1000 nm, as known in the art. The device 22c located on the side of the curved beam structure 16 in a location without a cavity below can be an NFET or a PFET, as an example.

Still referring to FIG. 2A, a metallized contact 105 is electrically connected to the source/drain of the device 22a (and device 22c). A first level wiring 115 is in electrical connection with the metallized contact 105. A via connection 120 connects the first level wiring 115 to a second level wiring 125. In embodiments, the poly gate 102, the metallized contact 105 and the first level wiring 115 are provided in a lower or first interlevel dielectric material 135, e.g., oxide; whereas, the via connection 120 is provided in an upper interlevel dielectric material 140, e.g., oxide. In embodiments, the curved beam structure 16 includes a curvature as shown by line 150 to impart a tensile stress on the channel region of the device 22a. The device 22c located outside of the cavity 20 will have no stress imparted thereon.

For this embodiment, the cavity 20 is formed with a vent via 130 which extends through the dielectric layer 135 comprising the first level wire 115 and contact 105, the upper interlevel dielectric material 140, as well as through a SOI thin silicon layer 110 to reach the SOI buried oxide (BOX) 145. The SOI BOX 145 is removed through the vent via 130, leaving the cavity 20. In this embodiment, there is a tensile stress gradient on the released layers near the bottom of the curved beam structure 16, which causes the released layers to bend in a concave up fashion as shown by the dashed line 150. In this embodiment, a via dielectric seals the cavity 20 and freezes the beam structure 16 in the concave up curvature.

It should be understood that additional wiring and via levels could be formed above the second wiring level 125; and the curved beam structure 16 could be released at any point after the formation of the transistor 22a, such as after the second wiring level 125. Additionally, the cavity 20 could have been formed in the silicon handle wafer 18 under the BOX layer 145 before the deposition of dielectric layer 135 such that the FET 22a would be located near the top of the beam 16. In this case, either the curved beam structure 16 would need to be curved in a concave down fashion if the FET 22a was a NFET or in a concave up fashion if the FET 22a was a PFET. This is shown graphically in FIG. 2B.

Figure 2B:
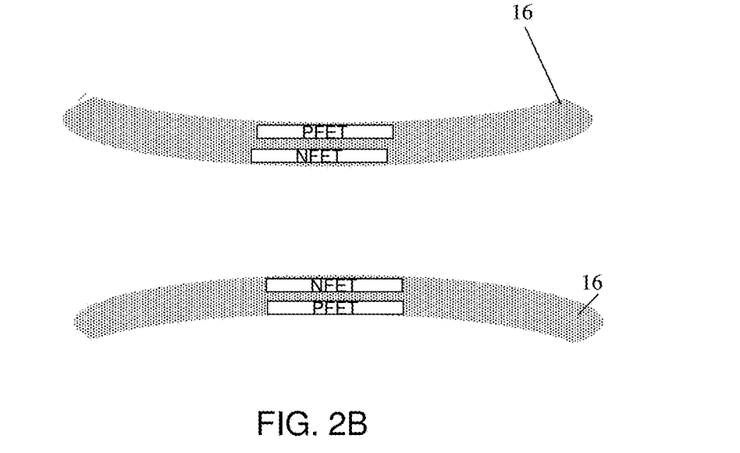

As shown representatively in FIG. 2B, it should be understood by those of skill in the art that the curvature of the curved beam structure 16 should be viewed from the perspective of the device itself. For example, in embodiments, and as represented in FIGS. 2A and 2B, the curved beam structure 16 can have a concave upward curvature (also shown in FIG. 2A), with an NFET device at or near a bottom of the beam structure such that tensile stress is placed on the NFET channel region; whereas a PFET device would be placed at or near a top of the curved beam structure such that a compressive stress is placed on the PFET channel region (see, e.g., FIG. 2B). That is, since, the NFET is formed on the bottom of the released beam structure 16 and the beam structure 16 is bent in a concave up fashion, a tensile stress is transferred to the NFET channel region, thus increasing the electron mobility and improving the NFET performance (and vice versa for the PFET). On the other hand, the curved beam structure can have a concave downward curvature with an NFET device 22b at or near a top of the curved beam structure such that tensile stress is placed on the NFET channel region; whereas, a PFET device would be placed at or near a bottom of the curved beam structure such that a compressive stress is placed on the PFET channel region.

In additional embodiments, as shown in FIG. 2A, the devices 22a, 22c can be bipolar transistors, MESFETs, PFETs, combinations thereof, or any active device whose performance is improved by placing it on a curved beam, amongst other examples. In this embodiment, the beam is curved concave up such that a tensile stress is placed on the NFET channel region and, to improve hole mobility in a PFET, the beam would need to be curved in a concave down fashion, e.g., see FIG. 2B.

As should thus be understood by those of skill in the art, in FIG. 2A, the devices are formed on the bottom of the beam structure 16. However, if the devices are formed on the top of the beam, then the reverse curvature would be needed. For example, a NFET formed on the top of the curved beam would need the beam to be curved in a concave down fashion to increase electron mobility in the NFET. For this embodiment, the device (FET) 22a, contacts 105, first level wiring 115, and dielectric 135 will have a known thickness before the cavity 20 release and, after the beam is curved, will continue to have approximately the same thickness. This means that, for this specific embodiment with the cavity via sealed with the first via 135, either there will continue to be a concave up topography over the curved beam structure 16 as the subsequent vias and wires are formed; or the dielectric 140 will need to be planarized such that the vias over the released cavity 20 are taller than the ones away from the released cavity.

As thus described herein, the curvature of the curved beam structure 16 will impart a certain stress on the device, increasing the channel mobility of the device. Illustratively, 5 degrees of bending can impart a stress of 400 MPa on the device(s), increasing channel mobility and Ron of the devices 22a, 22b by about 20%, compared to conventional layouts. It should be understood by those of skill in the art, though, that the stress imparted on the devices 22a, 22b can vary based on materials used for the curved beam structure 16 (e.g., based on the materials elastic modulus) and the location of the devices 22a, 22b on the curved beam structure 16, itself, e.g., the stress will decrease as the device moves away from the beam center.

Still referring to FIG. 2A, in any of the aspects described herein, the curved beam structure 16 can be composed of different materials of different dimensions (e.g., thickness) to provide different bending profiles and, hence, stress components. As a first example, a Sub-Atmospheric Chemical Vapor Deposition (SACVD) oxide with a tensile stress of 400 MPa can be used to achieve a 13 µm bending profile (e.g., downward bending profile). By way of a second example, the curved beam structure 16 can have a bending curvature profile of about 2 µm to about 10 µm.

In more specific embodiments, the curved beam structure 16 can be about 1 to 3 µm thick (although other thicknesses are contemplated herein) composed of, e.g., oxide, silicon and and/or metal or metal alloys or any combinations thereof, depending on the particular application and desired stress to be imparted on the devices. For example, the curved beam structure 16 can be composed of oxide and metals having a combined modulus of elasticity of about 100 GPa, as an example.

By way of another example, the curved beam structure 16 can be composed of oxide including, e.g., 100 nm of 100 MPa tensile oxide on a top surface or compressive oxide on a bottom surface, deposited using a conventional plasma enhanced deposition CVD (PECVD) process. In still another example, the curved beam structure 16 can be composed of: (i) 400 nm of oxide (e.g., SOI BOX) imparting a compressive stress of −250 MPa and (ii) 1000 nm of Si imparting a stress of 400 MPa. In this example, the curved beam structure 16 can have a bending curvature of 2 µm. In another alternative embodiment, the curved beam structure 16 can be composed of (i) 400 nm of oxide (e.g., SOI BOX) imparting a stress of −250 MPa, (ii) 100 nm of Si and 650 nm of SACVD oxide imparting a stress of 250 MPa, and (iii) 1.5 µm of zero stress film. In this example, the curved beam structure 16 can have a bending curvature of 13 µm.

Figure 3A:
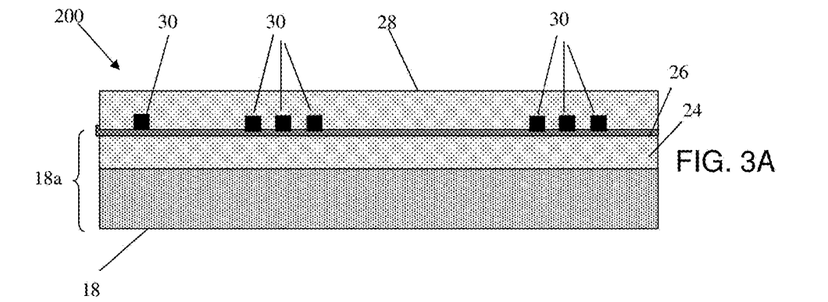
FIGS. 3A-3C show a curved beam structure, amongst other structures, and respective fabrication processes in accordance with additional aspects of the present disclosure.

FIGS. 3A-3C illustratively show the fabrication of the curved beam structure. Specifically, FIG. 3A shows an incoming structure 200 which can be used for an NFET switch, as an example (although PFET devices are also contemplated herein with the note that they would be placed at a different location of the beam structure as already described herein). The structure 200 includes an SOI substrate 18a formed by any conventional processes, e.g., SiMOX or other conventional bonding techniques. The SOI substrate 18a includes a semiconductor wafer (SOI handle wafer) 18, oxide (BOX) layer 24 and semiconductor material 26, as is well known in the art. The semiconductor wafer 18 and semiconductor material 26 may be composed of any suitable material including, but not limited to, Si, SiGe, SiGeC, SiC, alloys, GaAs, InAs, InP, and other III/V or II/VI compound semiconductors. A plurality of devices and related contacts, vias and wiring are shown representatively at reference number 30. The devices 30 are provided in dielectric material (oxide) 28 over SOI thin silicon layer 26, at different levels of the structure as shown in more detail in FIG. 2A in order to impart different stresses for different devices.

Figure 3B:
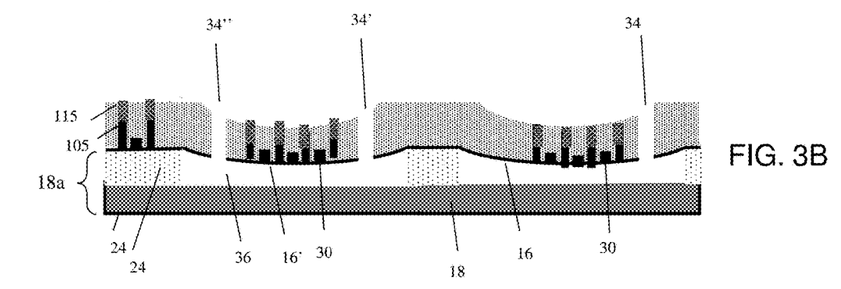

FIG. 3B shows the formation of two upward curved beam structures 16 and 16'. In particular, cavity venting vias 34, 34', 34" are formed through the materials, e.g., oxide layer 28, to expose the BOX layer 24. In optional embodiments, two or more cavity venting vias 34, 34', 34", can be formed through the materials, which will result in the formation of multiple small curved beam structures 16, 16' with a low curvature (e.g., 2 µm of bend). In embodiments, the vent holes 34, 34', 34" can be formed by conventional lithography and etching processes. For example, a resist formed over the dielectric material 28, e.g., oxide, is exposed to energy (light) to form a pattern (openings). An etching process, e.g., reactive ion etching (RIE), is then performed through the openings to form the vent holes 34, 34', 34".

Following the formation of the vent hole(s), the exposed BOX layer 24 can be cleaned, followed by a venting process to remove portions of the BOX layer 24 under the semiconductor layer 26 thereby forming the cavity 36. In embodiments, the venting process can include a vapor or aqueous HF-based etch chemistry of similar venting processes. The formation of the cavity 36 will result in an upward curved beam structure due to the stresses imparted by the different materials, e.g., released materials, as described with respect to at least FIG. 2A. In this way, the curvature of the beam will impart a stress in the channel regions of the devices 30. The resist can then be removed by a conventional oxygen ashing process or other known stripants. It should also be understood that in alternative structures, the venting holes 34, 34', 34" can be extending to the underlying substrate 18, which can be vented to form the cavity (instead of the BOX layer 24). If the cavity is formed in the silicon substrate 18, then a silicon etch, such as gaseous $XeF_2$; or aqueous NaOH or KOH could be used.

Figure 3C:
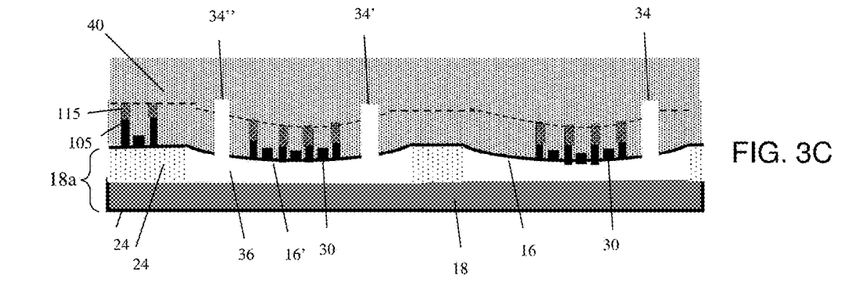

After the cavity venting shown in FIG. 3B, FIG. 3C shows additional dielectric material 40 (e.g., oxide) formed and optionally planarized over the curved beam structure(s), followed by via and wire formation. In embodiments, the dielectric material 40 can be deposited using any conventional deposition process, e.g., CVD. Following the deposition of the dielectric material 40, an optional CMP process is performed to planarize the dielectric material 40. The dielectric material 40 will plug the vent holes 34, 34', 34". In alternative embodiments, a capping material such as an oxide or nitride material may be used to plug the vent holes 34, 34', 34".

The upper wiring layers (not shown) can be formed by in the dielectric material 40 using conventional etching and deposition processes, e.g., using conventional CMOS processes, followed by a chemical mechanical polishing (CMP), as needed. The upper wiring layers will naturally be longer than the upper wiring layers, on sides of the cavity 36 (e.g., sides of the bent beam structure 16).

It should be understood by those of ordinary skill in the art that the upper material layers, e.g., additional insulator material 40, can contribute to the curvature of the curved beam structure 16. For example, the insulator material can account more or less curvature depending on the stress of the film. The effect of post cavity release films and film stress on the beam curvature can be reduced or eliminated by forming a cavity over the beam, as shown in FIG. 4.

Figure 4:
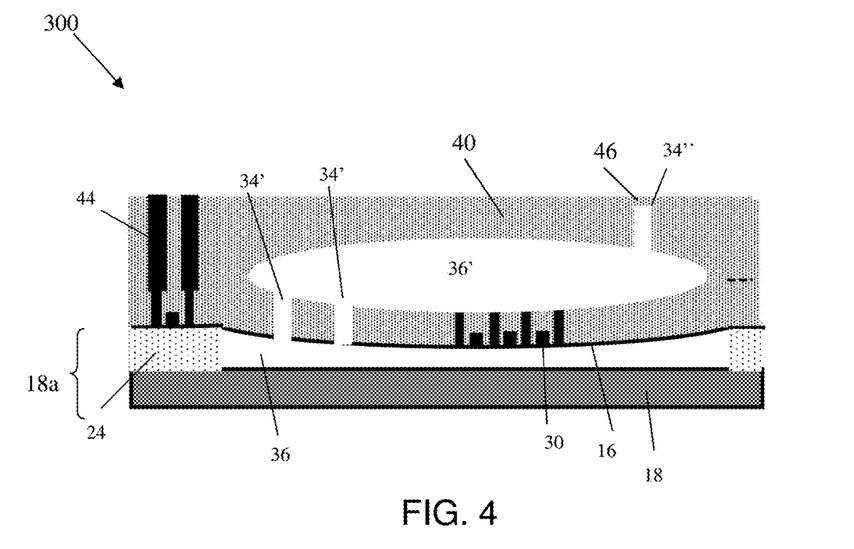
FIG. 4 shows beam structure between an upper cavity and a lower cavity, amongst other features, and respective fabrication processes in accordance with additional aspects of the present disclosure.

FIG. 4 shows a cavity above and below the curved beam structure, amongst other features, and respective fabrication processes in accordance with additional aspects of the present disclosure. To fabricate the additional cavity 36', a venting process similar to that described with respect to FIGS. 3A-3C can be implemented, using one or more vent holes 34" formed within the oxide material 40, exposing a portion of the substrate material to be vented, e.g., oxide material (although embodiments also contemplate that the underlying substrate can be etched to form the cavity). Alternatively, a cavity above the beam could be formed with a non-oxide sacrificial material, such as silicon, as is known in the art. For a cavity above the beam to be formed from sacrificial silicon, a silicon region is deposited, patterned, and etched; oxide is deposited and planarized, additional oxide is deposited, and the sacrificial silicon is removed through vent holes using, for example, $XeF_2$ gas, as known in the art as should be known to those of skill in the art in view of the description therein.

In embodiments, the venting process will result in the formation of the upper cavity 36' and the lower cavity 36 and the release of the beam material will result in the formation of the curved beam structure 16. The vent hole 34" can then be sealed with a dielectric material 46. For example, compressive PECVD or similar oxide processes can be used to form a cap deposited in the vent holes 34" and, in embodiments, on the dielectric material 40. The curved beam structure 16 will impart stresses on any devices which are formed on a top or bottom of the curved beam structure 16.

Figure 5A:
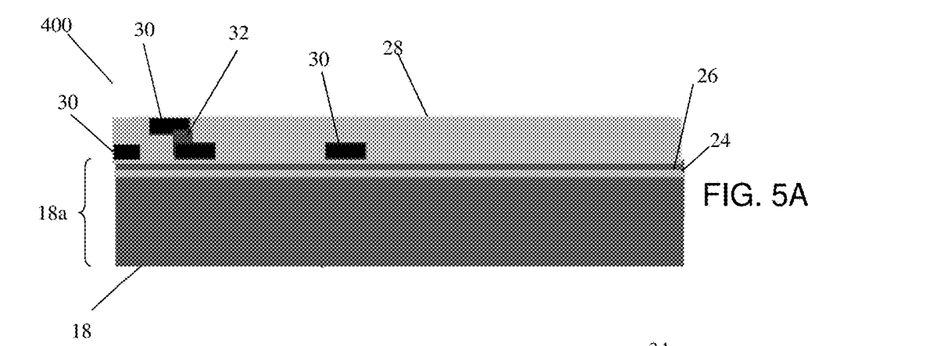
FIGS. 5A-5E show a curved beam structure with a backside through substrate via (TSV), amongst other features, and respective fabrication processes in accordance with additional aspects of the present disclosure.

FIGS. 5A-5E show a curved beam structure with a backside through substrate via (TSV), amongst other structures, and respective fabrication processes in accordance with additional aspects of the present disclosure. More specifically, as shown in FIG. 5A, the structure 400 includes an SOI substrate 18a comprising a semiconductor wafer 18, oxide (BOX) layer 24 and semiconductor material 26, as is well known in the art. The semiconductor wafer 18 and semiconductor material 26 may be composed of any suitable material as already described herein. A plurality of wiring structures and/or devices 30 and via interconnect structures 32 connecting to the wiring structures and/or devices 30 are provided in dielectric material (oxide) 28, at different levels of the structure.

Figure 5B:
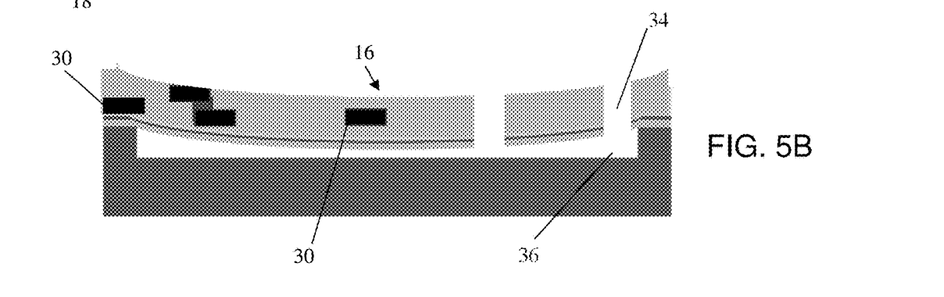

FIG. 5B shows the formation of the curved beam structure 16 using one or more vent holes 34 formed through the materials, e.g., BOX layer 24, semiconductor material 26 and dielectric material 28, to expose the underlying semiconductor wafer 18 (or in the preferred embodiment, to expose the BOX layer 24 for venting and cavity formation). In embodiments, the vent holes 34 can be formed by conventional lithography and etching processes. Following the formation of the vent hole(s), the exposed substrate material can be cleaned with an Hf solution, followed by a venting process to remove portions of the semiconductor wafer 18 under the BOX layer 24. In embodiments, the venting process can include an etch chemistry of $XeF_2$ or similar venting processes. The formation of the cavity 36 will result in a curved beam structure 16 due to the stresses imparted by the different materials, as described with respect to at least FIG. 2A. It should be noted that a lower and upper cavity formation process, as described with respect to FIG. 4, is also contemplated with the embodiment described herein.

Figure 5C:
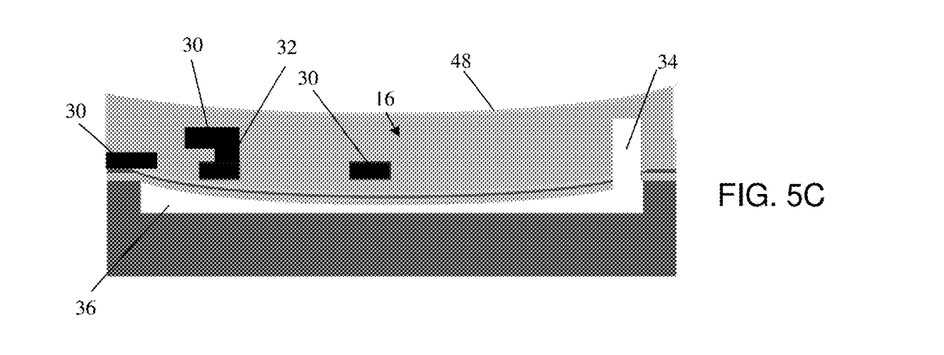

FIG. 5C shows the deposition of a low stress sealing material 48 to seal the vent holes 34. In embodiments, the low stress sealing material 48 is an oxide material that will seal the vent holes 34. The sealing material 48 can be deposited to a few microns in thickness; although other dimensions are contemplated herein. It should be understood by those of ordinary skill in the art that this sealing material can also be used in any of the aspects described herein.

Figure 5D:
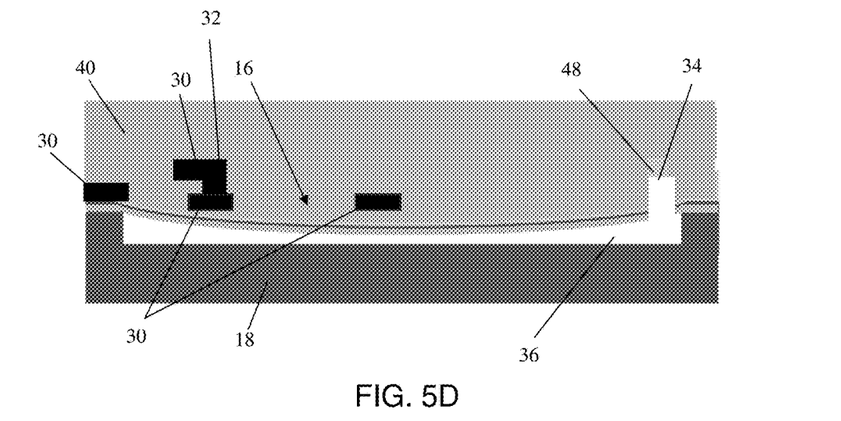

In FIG. 5D, additional dielectric material 40 (e.g., oxide) is formed and optionally planarized over the curved beam structure(s) 16 to form upper wiring layers. As should be noted herein, the upper material layers, e.g., additional insulator material 40, can contribute to the curvature of the curved beam structure 16. For example, the insulator material can account additional curvature when using thicker beam structures having less curvature with a same stress gradient as thinner curved beam structures.

Figure 5E:
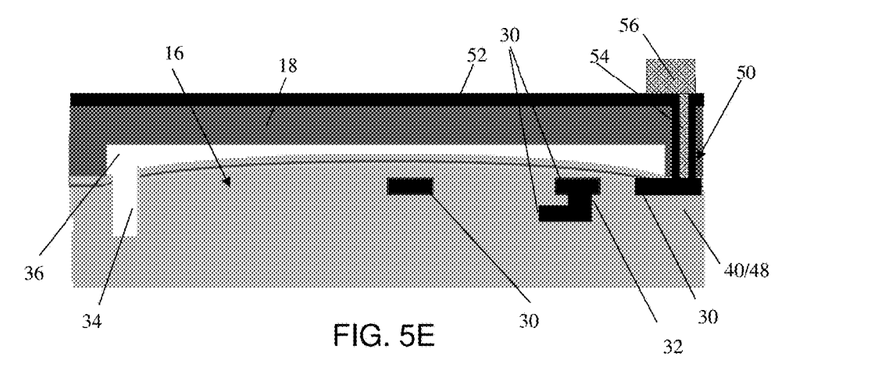

In FIG. 5E, the structure is flipped upside down and the semiconductor wafer 18, in an optional process, is thinned by a backside grinding process. In this representation, the curved beam structure 16 is now curved upwards. A through via 50 is formed through the semiconductor wafer 18, followed by a deposition of insulator material 52. In embodiments, the insulator material 52 can be an oxide material that is deposited on the surface of the semiconductor wafer 18 and on the sidewalls of the through via 50. A contact material 54 is deposited within the through via 50 to a front side of the structure, in contact with a wiring structure or device 30 at a lower level of the device. In embodiments, the contact material 54 can also contact a silicide region. In embodiments, the contact material 56 can be copper, aluminum or other conductive material which also contacts a solder bumper or other I/O structure 56. In this way, the resultant structure can be a single beam structure with a high curvature (e.g., 13 μm of bend) with a TSV for a backside I/O.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising
   a curved beam structure formed from at least one stressed material;
   a cavity below the curved beam structure; and
   at least one semiconductor device on a top portion or a bottom portion of the curved beam structure whose carrier mobility is increased or decreased by a curvature of the curved beam structure,
   wherein the cavity below the curved beam structure is formed in a BOX material of silicon on insulator (SOI) technologies.

2. The structure of claim 1, wherein the curved beam structure is a plurality of curved beam structures.

3. The structure of claim 1, wherein the curved beam structure imparts a stress on the at least one semiconductor device.

4. The structure of claim 1, wherein the curved beam structure has a concave upward curvature and the semiconductor device is an NFET at or near the bottom or PFET at or near the top of the curved beam structure.

5. The structure of claim 1, wherein the curved beam structure has a concave downward curvature and the semiconductor device is a PFET at or near the bottom or an NFET at or near the top.

6. The structure of claim 1, further comprising a cavity above the curved beam structure.

7. The structure of claim 1, further comprising an insulated through hole via structure for a backside I/O.

8. The structure of claim 1, wherein the semiconductor device is an NPN.

9. The structure of claim 1, wherein the semiconductor device is a nominal FET.

10. The structure of claim 1, wherein the semiconductor device is a silicon on insulator (SOI) NFET switch structure.

11. The structure of claim 1, wherein the curved beam structure has a beam curvature of about 5 degrees.

12. A structure comprising:
- a curved beam structure composed of at least an oxide material and semiconductor material;
- a cavity in a substrate material which is under the curved beam structure; and
- a semiconductor device on the curved beam structure which has a stress imparted thereon from a curvature of the curved beam structure which affects a carrier mobility of the semiconductor device, wherein the curved beam structure has a concave upward curvature and the device is an NFET at or near a bottom or a PFET at or near a top of the curved beam structure.

13. The structure of claim 12, wherein the substrate material is an oxide material of a silicon on insulator wafer.

14. The method of claim 12, further comprising a cavity formed above the curved beam structure.

15. The structure of claim 12, wherein the curved beam structure has a concave downward curvature and the device is a PFET at or near a bottom or an NFET at or near a top.

16. The structure of claim 12, wherein the device is at least one of NPN, a nominal FET and a silicon on insulator (SOI) NFET switch structure.

17. A method, comprising:
- forming a curved beam structure by venting material under semiconductor material to form a cavity and release a stress of material which composes the curved beam structure; and
- forming at least one semiconductor whose carrier mobility is increased or decreased by the beam curvature near a top or a bottom surface of the curved beam structure such that a stress is imparted on an active region of the at least one semiconductor device,
- wherein the material that is vented is an insulator material of a silicon on insulator substrate.

\* \* \* \* \*